United States Patent
Yamaguchi

(10) Patent No.: US 7,439,532 B2
(45) Date of Patent: Oct. 21, 2008

(54) SOLID STATE RELAY, ELECTRONIC DEVICE, AND METHOD FOR MANUFACTURING SOLID STATE RELAYS HAVING A FIRST CONTROL TERMINAL, A FIRST OUTPUT TERMINAL AND A SECOND OUTPUT TERMINAL AS LEAD TERMINALS

(75) Inventor: Hiroshi Yamaguchi, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 479 days.

(21) Appl. No.: 11/324,253

(22) Filed: Jan. 4, 2006

(65) Prior Publication Data

US 2006/0151795 A1 Jul. 13, 2006

(30) Foreign Application Priority Data

Jan. 12, 2005 (JP) ............................. 2005-005375

(51) Int. Cl.
*G02B 27/00* (2006.01)
(52) U.S. Cl. .................................. 250/551; 250/214 R
(58) Field of Classification Search ................. 250/551, 250/214 R, 239, 205, 214 SG; 327/455, 327/428, 456, 476, 514, 512, 379, 313
See application file for complete search history.

(56) References Cited

U.S. PATENT DOCUMENTS 5,708,277 A * 1/1998 Murayama et al. .......... 250/551

FOREIGN PATENT DOCUMENTS

| JP | 64-37136 A | 2/1989 |
| JP | 7-106629 A | 4/1995 |

* cited by examiner

*Primary Examiner*—Que T Le
(74) *Attorney, Agent, or Firm*—Birch, Stewart, Kolasch & Birch, LLP

(57) ABSTRACT

A light-receiving element for receiving a signal light from a light-emitting element and a load-controlling power element are mounted on an output-side lead frame of a solid state relay. A first electrode of the light-receiving element is connected to a first control terminal and a second electrode of the light-receiving element is connected inside a resin sealing portion to a gate electrode of the load-controlling power element. A first electrode of the load-controlling power element is connected to a first output terminal and a second electrode of the load-controlling power element is connected to a second output terminal. The first control terminal, the first output terminal, and the second output terminal each individually lead out to the exterior of the resin sealing portion as lead terminals.

20 Claims, 10 Drawing Sheets

(A)

(B)

SOLID STATE RELAY, ELECTRONIC DEVICE, AND METHOD FOR MANUFACTURING SOLID STATE RELAYS HAVING A FIRST CONTROL TERMINAL, A FIRST OUTPUT TERMINAL AND A SECOND OUTPUT TERMINAL AS LEAD TERMINALS

BACKGROUND ART

This application claims priority under 35 U.S.C. § 119(a) on patent application Ser. No. 2005-005375 filed in Japan on Jan. 12, 2005, the entire contents of which are hereby incorporated by reference.

The present invention relates to solid state relays ("SSRs") to which protective elements can easily be connected as a measure for protecting against surges, to electronic devices equipped with such SSRs, and to methods for manufacturing such SSRs.

SSRs which use semiconductor elements as switching elements for switching on and off a power supply to a load are well known.

SSRs are required to have a high breakdown voltage as they directly control switching on and off the power supply. For this reason, SSRs are equipped with high-breakdown-voltage, high-power semiconductor elements such as triads as load-controlling power elements. As the need arises to ensure isolation between a primary (input) side which acts as a control system with a relatively low voltage and a secondary (output) side with a relatively high voltage which handles a large power supply, optical coupling (photo couplers) which can easily achieve input/output isolation are used for transmission of signals between the input and output sides.

This kind of SSR achieves good input/output isolation and control, and is therefore often used in electronic devices such as power devices, home appliances, inverter controllers.

FIG. 10 is a partially cut-away perspective view showing an example of a conventional SSR.

SSR 50 comprises a light-emitting diode 51 mounted as a light-emitting element on an input side, and a photo-triad 52 and a triad 53, mounted on an output side as a light-receiving element and as a load-controlling power element, respectively.

The light-emitting diode 51 is die-bonded using silver paste or the like and is wire-bonded using gold wire or the like to an input-side lead frame 55. The photo triad 52 is die-bonded using a silver paste or an insulating paste such as a polyimide resin, and wire-bonded using gold wire or the like to an output-side lead frame 56.

The light-emitting diode 51 and the photo triad 52 are disposed facing each other, configured to allow transmission of signal light there between. The inner sides of the light-emitting diode 51 and the photo triad 52 are sealed with resin, using an inner resin sealing portion 57 of white translucent resin, and sealed with resin, using a black resin sealing portion 58 from its outside.

Like the photo triad 52, the triad 53 is die-bonded and wire-bonded to an output-side lead frame 56 and driven by a current signal from the photo triad 52 when this last receives a signal light from the light-emitting diode 51, thereby constituting a switching element (not shown) which controls switching on and off the power supply to the load.

FIG. 11 is a wiring diagram of the conventional SSR shown in FIG. 10. This type of conventional SSR is disclosed in JP H7-106629A, for example.

The SSR 50 is provided, on the input side, with an anode terminal Ta to which is connected an anode 51a of the light-emitting diode 51 and a cathode terminal Tk to which is connected a cathode 51k of the light-emitting diode. On the output side are provided a first output terminal Tp1 to which is connected a first electrode 53f of the triad 53 and a second output terminal Tp2 to which is connected a second electrode 53s of the triad 53. A first electrode 52f of the photo triad 52 is connected to the first output terminal Tp1 and a second electrode 52s of the photo triad 52 is connected to a gate electrode 53g of the triad 53.

This type of SSR 50 is used in electronic devices such as power devices. However, the growing diversification of the environment in which electronic devices are used has meant such devices are often exposed to external current and voltage surges, leading to frequent occurrence of breakdown of the photo triad 52 by a surge. Destruction of the photo triad 52 by a surge entails the risk of destroying the electronic device itself, creating a need for measures against surges in order to stabilize and improve the reliability of operation of the SSR 50.

FIG. 12 is a wiring diagram of a solid state relay incorporating a countermeasure against surges. FIG. 13 is a schematic cross-sectional view of a case in which a protective element (see below) shown in FIG. 12 is applied to the conventional solid state relay shown in FIG. 10.

An SSR 60 (FIG. 12) which incorporates a countermeasure against surges is identical to the conventional example shown in FIG. 11 as regards the basic circuit configuration, but differs in that a built-in resistor R3 is connected between the first electrode 52f of the photo triad 52 and the first electrode 53f of the triad 53 as a protective element.

The SSR 50 shown in FIG. 13 is equipped with the light-emitting diode 51 on the input-side lead frame 55 and the photo triad 52 and the triad 53 on the output-side lead frame 56 facing the input-side lead frame 55, the light-emitting diode 51, photo triad 52, triad 53, input-side lead frame 55, and output-side lead frame 56 being sealed with resin by the inner resin sealing portion 57 and sealed with resin by the resin sealing portion 58 from its outside.

On the SSR 50, on which the input-side lead frame 55 and the output-side lead frame 56 are opposed and which is sealed with resin (using transfer molding) by the inner resin sealing portion 57 and the resin sealing portion 58, the input-side lead frame 55 and the output-side lead frame 56 extend over almost the entire area of the inner resin sealing portion 57 and the resin sealing portion 58 in order to raise heat diffusion.

If the SSR 50 were equipped with the built-in resistor R3 (indicated by the broken lines) as a protective element thicker than the chip thickness of the light-emitting diode 51, the photo triad 52, and the triad 53, the shortest electrical distance between the input-side lead frame 55 and the output-side lead frame 56 would change from a conventional distance d5 to a distance d6. In other words, the breakdown voltage would drop and the risk of dielectric breakdown would rise because of the shorter electrical distance between the input-side lead frame 55 and the output-side lead frame 56. Accordingly, a need arises to increase the distance between the input-side lead frame 55 and the output-side lead frame 56 in order to maintain the insulation between the input-side lead frame 55 and the output-side lead frame 56.

However, increasing the distance between the input-side lead frame 55 and the output-side lead frame 56 creates the need to raise the luminance of the light-emitting diode 51 as a light-emitting element and the sensitivity of the photo triad 52 as a light-receiving element in order to achieve accurate light transmission.

In order to raise the luminance of the light-emitting diode 51, the current flowing to the light-emitting diode 51 must be increased, but this is not preferable from the perspective of power consumption, heat and so on. In order to raise the sensitivity of the photo triad 52, the surface area of the photo triad 52 needs to be enlarged, but this is not preferable from the perspective of compactness, current leakage, and so on. Accordingly, mounting the built-in resistor R3 which is thicker than the chip thickness of the light-emitting diode 51, the photo triad 52, and the triad 53 is unrealistic and difficult to realize.

The present invention was conceived with the above-mentioned circumstances in mind, and its object is to provide a highly-reliable SSR capable of preventing breakdown of a light-receiving element by a surge, electronic devices provided with such an SSR, or a manufacturing method for manufacturing such an SSR.

SUMMARY OF THE INVENTION

In order to achieve the above-mentioned object, the SSR according to the present invention provides an SSR comprising: a light-emitting element which is mounted on an input-side lead frame; a light-receiving element which is mounted on an output-side lead frame and receives light from the light-emitting element; a load-controlling power element which is mounted on the output-side lead frame and driven by the light-receiving element; and a resin sealing portion which seals with resin the light-emitting element, the light-receiving element, and the load-controlling power element; wherein a first electrode of the light-receiving element is connected to a first control terminal, a first electrode of the load-controlling power element is connected to a first output terminal, a second electrode of the load-controlling power element is connected to a second output terminal, and a second electrode of the light-receiving element is connected to a gate electrode of the load-controlling power element, and the first control terminal, the first output terminal, and the second output terminal each individually lead out to the exterior of the resin sealing portion as lead terminals.

With this configuration, the lead terminals to which the electrodes of the light-receiving element are connected lead out to the exterior of the resin sealing portion, making it possible to connect a protective element as a countermeasure against surges to the light-receiving element outside the resin sealing portion. In other words, it is possible to externally control the balance between the drive current flowing to the light-receiving element and the load current flowing to the load-controlling power element. This makes it possible to provide a prescribed drive current to the light-receiving element, which enables accurate operation of the load-controlling power element, in turn making it possible to ensure stable operation, reducing malfunctions. This prevents breakdown of the light-receiving element by current and voltage surges, allowing provision of a highly reliable SSR with no risk of malfunction. The ability to connect a protective element outside the resin sealing portion in order to protect the light-receiving element as a countermeasure against surges provides the effect of making it possible to provide an SSR capable of preventing a drop in input/output breakdown voltage inside the resin sealing portion.

With the SSR according to the above-mentioned configuration, it is preferable for an externally-connected protective element to be connected between the first control terminal and the first output terminal outside the resin sealing portion.

With this configuration, connecting the externally-connected protective element (an externally-connected resistor) between the first control terminal and the first output terminal obviates the need for providing a protective element inside the resin sealing portion, thereby not affecting the input/output insulation distance inside the resin sealing portion. In other words, it is possible to prevent breakdown of the light-receiving element by surges by connecting the protective element (the externally-connected protective element) while simultaneously preventing a drop in the breakdown voltage between the input-side lead frame and the output-side lead frame (i.e., the breakdown voltage between the input and the output in the resin sealing portion).

Further, in the SSR according to the above configuration, it is preferable for a built-in protective element to be connected between the first electrode of the light-receiving element and the first electrode of the load-controlling power element inside the resin sealing portion.

With this configuration, the input/output insulation distance (i.e., the breakdown voltage between the input and the output) is not affected even if the built-in protective element is provided, because the greater selection of built-in protective elements (built-in resistors) makes it possible to connect a built-in protective element with a small shape (especially the dimension in the direction which affects the breakdown voltage between the input and the output). In other words, it is possible to externally control the balance between the drive current flowing to the light-receiving element and the load current flowing to the load-controlling power element. In other words, passing the prescribed drive current to the light-receiving element is made possible, which in turn makes possible accurate operation of the load-controlling power element.

Further, in the SSR according to the above configuration, it is preferable for the second electrode of the light-receiving element to be connected to the second control terminal, and for the second control terminal to individually lead out to the exterior of the resin sealing portion as a lead terminal.

With this configuration, connecting the second electrode of the light-receiving element to a gate terminal of the external load-controlling power element is made possible by leading the second control terminal to which the second electrode of the light-receiving element is connected out of the resin sealing portion as a lead terminal. This enables control of a plurality of the load-controlling power elements, making distribution (division) of the load current by the plurality of the load-controlling power elements possible even when the load current controls a large load. Accordingly, an SSR with greater margin in heat release specifications and rated current specifications is possible. Preventing breakdown of the light-receiving element by surges is also possible because the protective element can be connected to the second control terminal which has been led to the exterior.

Further, with the SSR according to the above configuration, it is preferable for the first control terminal and the first output terminal to be provided with a mounting portion for mounting the externally-connected protective element outside the resin sealing portion.

With this configuration, the externally-mounted protective element can easily be mounted thanks to the ease with which the externally-mounted protective element can be disposed, thereby obviating the need for a wiring pattern for connecting the externally-connected protective element to the wiring substrate on which the SSR is mounted.

With the SSR according to the above-mentioned configuration, it is preferable for the first control terminal and the first output terminal to be mutually interconnected via a bridging portion outside the resin sealing portion.

With this configuration, cutting the bridging portion and connecting the externally-connected protective element is possible when connecting the externally-connected protective element due to a need for a countermeasure against surges. Maintaining the bridging portion as is when no countermeasure against a surge is needed is also possible. In other words, the need for a countermeasure against surges varies with the usage environment, so a multi-purpose SSR is achievable because the lead frame becomes multi-purpose, allowing the selection of a connection for the protective element in accordance with the need for a countermeasure against surges.

Further, in the SSR according to the above configuration, it is preferable that the input-side lead frame and the output-side lead frame be disposed facing each other.

With this configuration, an SSR with a high transmission efficiency for signal light is achieved.

Further, in the SSR according to the above configuration, it is preferable for the resin sealing portion to be such that the input-side lead frame and the output-side lead frame are sealed with resin to a dual in-line package.

With this configuration, attachment to the wiring substrate to which the SSR is to be mounted is easy and an SSR is achieved to which connection of the externally-connected protective terminal is easy.

With the SSR according to the above configuration, it is preferable for the light-emitting element to be a light-emitting diode, the light-receiving element a photo triad, and the load-controlling power element a triad.

With this configuration, a highly efficient SSR is achieved that controls a large power supply at high speeds.

Further, the above-mentioned SSR according to the present invention may have as another object the enlargement of the resin sealing portion or the prevention of short circuits between the first output terminal and the second output terminal, which are problems which may arise when increasing the number of terminals leading to the exterior in order to achieve the object described above.

In order to achieve the present object, in the SSR according to the above configuration it is preferable for the first output terminal to be disposed between the first control terminal and the second output terminal.

With this configuration, the distance between the first output terminal and the second output terminal as lead terminals can be set as needed even a new first control terminal is added, thereby achieving an SSR which can be used safely as short circuits outside the resin sealing portion between the first output terminal and the second output terminal are prevented.

In order to achieve the present object, in the SSR according to the above configuration it is preferable for the distance between the first control terminal and the first output terminal to be smaller than the distance between the first output terminal and the second output terminal.

With this configuration, the distance between the lead terminals can be minimized because the first control terminal and the first output terminal are of approximately the same potential, making it possible to prevent enlargement of the outward form of the resin sealing portion due to increasing the number of the first control terminal as a lead terminal leading to the exterior. In other words, miniaturization of the SSR is possible.

In order to achieve the present object, in the SSR according to the above configuration it is preferable for the terminal width of the first control terminal and the first output terminal to be narrower than the terminal width of the other lead terminals.

With this configuration, it is possible to prevent enlargement of the outward form of the resin sealing portion due to increasing the number of the first control terminal as a lead terminal to which the first electrode of the light-receiving element is connected.

In order to achieve the above object, the electronic device according to the present invention is equipped with the above-mentioned SSR according to the present invention.

With this configuration, it is possible to provide a highly reliable electronic device resistant to current and voltage surges.

Further, to achieve the above object, the manufacturing method for SSRs according to the present invention is a manufacturing method for an SSR comprising: a light-emitting element which is mounted on an input-side lead frame; a light-receiving element which is mounted on an output-side lead frame and receives light from the light-emitting element; a load-controlling power element which is mounted on the output-side lead frame and driven by the light-receiving element; and a resin sealing portion which seals with the light-emitting element, the light-receiving element, and the load-controlling power element; wherein a first electrode of the light-receiving element is connected to a first control terminal, a first electrode of the load-controlling power element is connected to a first output terminal, a second electrode of the load-controlling power element is connected to a second output terminal, and a second electrode of the light-receiving element is connected to a gate electrode of the load-controlling power element, the first control terminal, and the first output terminal, and the second output terminal each individually lead out to the exterior of the resin sealing portion as lead terminals; the method including: a step of mounting the light-emitting element, the light-receiving element, and the load-controlling power element onto the output-side lead frame in which the resin sealing portion the first control terminal and the first output terminal are interconnected via a bridging portion outside; a step of sealing with the light-emitting element, the light-receiving element, and the load-controlling power element; a step of cutting the bridging portion; and a step of connecting an externally-connected protective element between the first control terminal and the first output terminal.

With this configuration, it is possible to cut the bridging portion and connect the externally-connected protective element, achieving a manufacturing method for multi-purpose SSRs which allow a selection of whether or not to cut the bridging portion in accordance with the need to connect the protective element as a countermeasure against surges according to the usage environment.

BRIEF DESCRIPTION OF THE DRAWINGS

FIG. 8(A) is a plan view of the SSR and FIG. 8(B) is a lateral view including a partial cross-section in the direction of arrow B-B in FIG. 8(A).

DESCRIPTION OF THE PREFERRED EMBODIMENTS

Below follows a description of a first embodiment of the present invention, with reference to the drawings.

Figure 1:
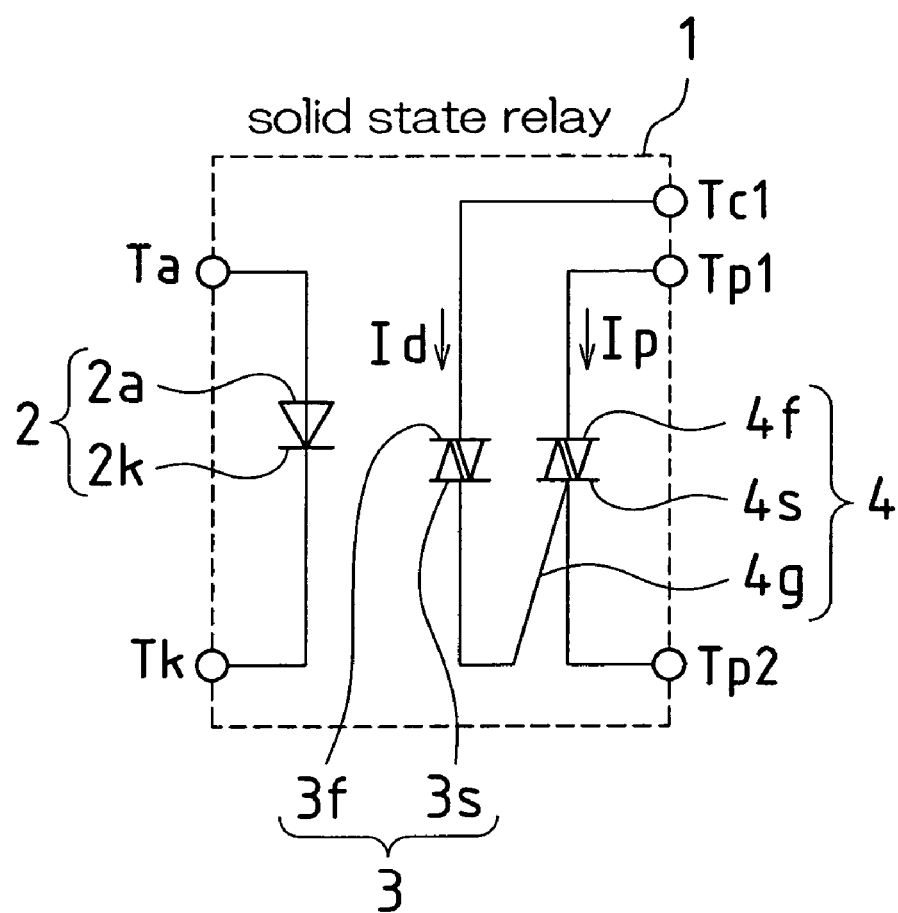
FIG. 1 is a wiring diagram of an SSR according to a first embodiment of the present invention.

FIG. 1 is a wiring diagram of an SSR according to a first embodiment of the present invention.

A light-emitting diode 2 is mounted (connected, equipped) as a light-emitting element on an input-side (light-emitting side) lead frame (not shown) of a SSR 1, which is sealed with resin. An anode $2a$ and a cathode $2k$ of the light-emitting diode are connected to an anode terminal Ta and a cathode terminal Tk, respectively, as lead terminals which lead to the exterior of a resin sealing portion (not shown). Note that the light-emitting element is not limited to the light-emitting diode 2, but may be any element which emits light in response to a signal which is input.

Further, to an output-side (light-receiving side) lead frame (not shown) of the SSR 1 are mounted (connected, equipped) a photo triad 3 as a light-receiving element which receives a signal light from the light-emitting diode 2 and a triad 4 as a load-controlling power element. A first electrode $3f$ of the photo triad 3 is connected to the first control terminal Tc1 and a second electrode $3s$ of the photo triad 3 is connected to a gate electrode $4g$ of the triad 4 inside the resin sealing portion. Note that the light-receiving element is not limited to the photo triad 3, but may be any element which outputs a fixed current upon receiving light. For example, a photo IC may be used in which a photo diode and a thruster, or the like, are combined and configured as a circuit. Further, the load-controlling power element is not limited to the triad 4, but may be any electric element provided with a gate electrode for controlling current.

A first electrode $4f$ of the triad 4 is connected to the first output terminal Tp1 and a second electrode $4s$ of the triad 4 is connected to a second output terminal Tp2. The first control terminal Tc1, the first output terminal Tp1, and the second output terminal Tp2 each individually lead out to the exterior of the resin sealing portion as lead terminals.

Turning the SSR 1 on is performed in the following steps. Passing a forward current to and thereby turning on the light-emitting diode 2 causes a signal light to be produced by the light-emitting diode 2. When the photo triad 3 receives the signal light from the light-emitting diode 2, and is thereby switched on, a control current Id flows. The gate of the triad 4 fires when the control current Id is equal to or greater than the gate trigger current of the triad 4, thereby switching on the triad 4, thereby switching the SSR 1 to an on state, whereby a load current Ip then flows in accordance with a load (not shown). The load current Ip can be controlled by switching the triad 4 on and off in this manner.

According to the present embodiment, connecting a conveniently selected protective element (for example, a resistor R1 as a protective element: see FIG. 2) outside the resin sealing portion between the first control terminal Tc1 and the first output terminal Tp1 is possible because the first control terminal Tc1 and the first output terminal Tp1 each individually lead to the exterior. Accordingly, selection of the protective element is free, meaning the resistance of the protective element can be conveniently selected, which makes it possible to adjust the balance between the control current Id which flows to the photo triad 3 and the load current Ip which flows to the triad 4, making possible accurate operation of the triad 4. In other words, operating the triad 4 in a stable manner can prevent malfunctions. Further, the photo triad 3 can be protected by the protective element, so a highly reliable SSR 1 can be achieved which can prevent breakdown of the photo triad 3 due to current or voltage surges.

Figure 11:
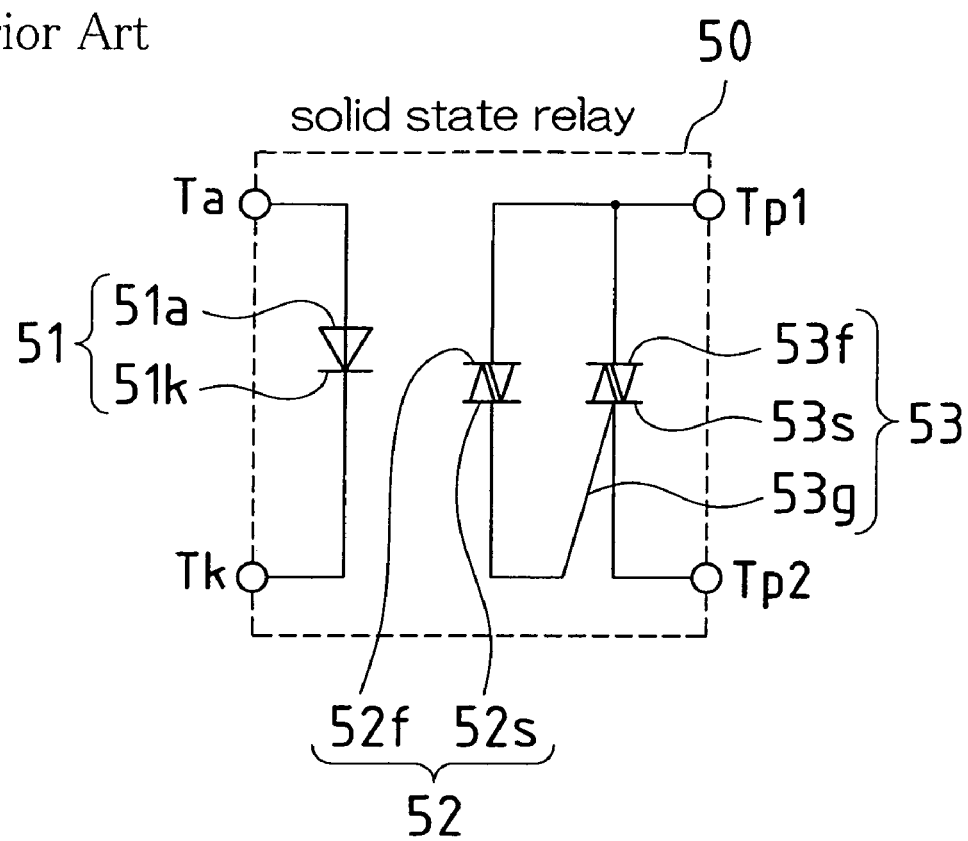
FIG. 11 is a wiring diagram of the conventional SSR shown in FIG. 10.
Figure 12:
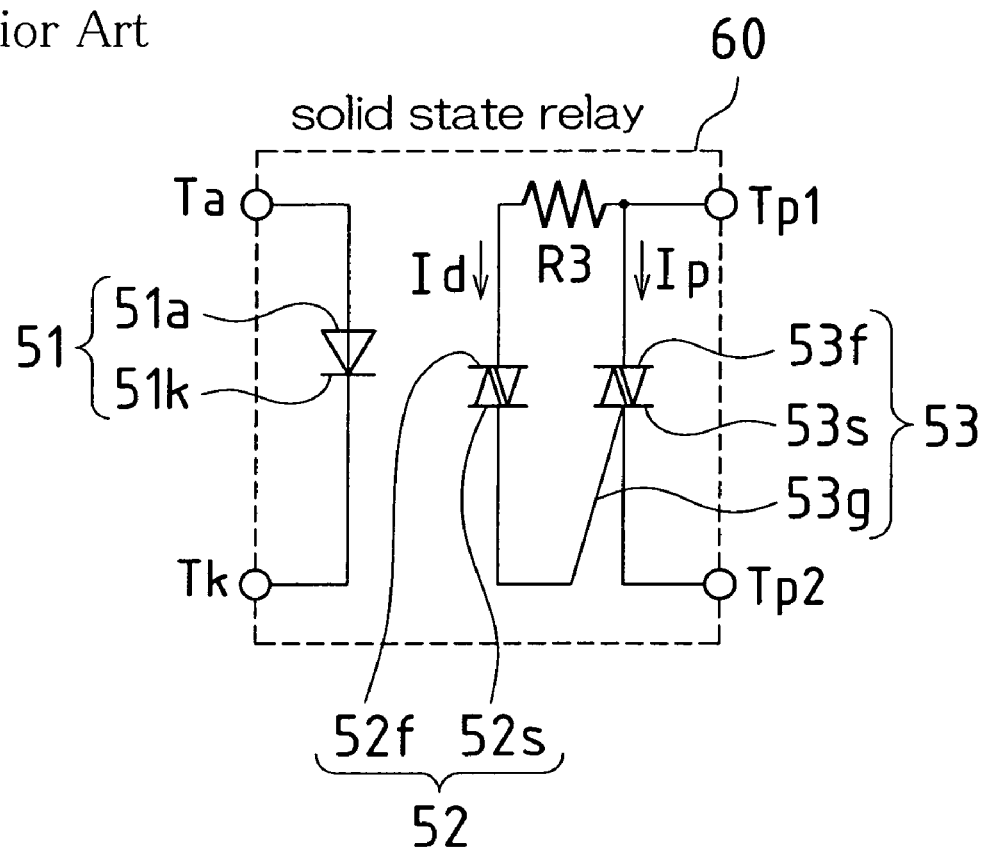
FIG. 12 is a wiring diagram of an SSR incorporating a countermeasure against surges.
Figure 13:
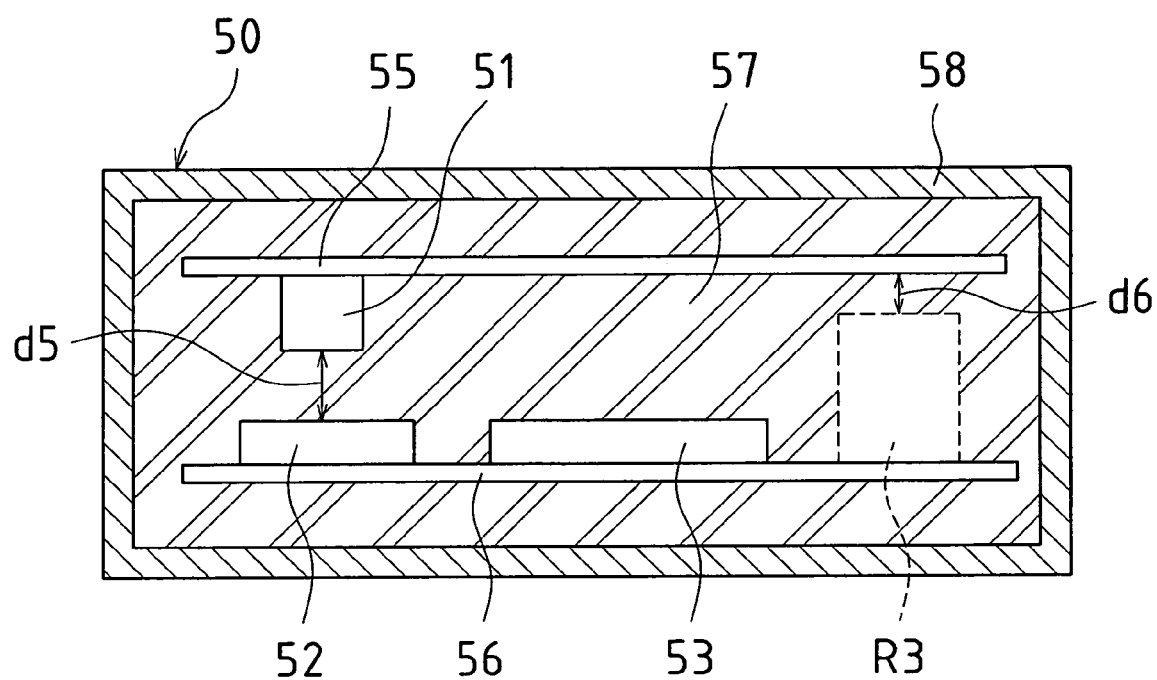
FIG. 13 is a schematic cross-sectional view of a case in which a protective element shown in FIG. 12 is applied to the conventional SSR shown in FIG. 10.

The input-side lead frame and the output-side lead frame of the SSR 1 can be disposed facing each other as in the conventional art shown in FIG. 11, for example, so the transmission efficiency of the signal light can be raised. The lead frame is preferably made of copper in consideration of heat release properties. Further, the input-side lead frame and the output-side lead frame may be disposed side-by-side in a plane by using appropriate reflective means, for example.

Further, as regards the form of the resin sealing portion, resin sealing by transfer molding is preferable from the vantage points of air-tightness, moisture resistance, the ability to be mass produced, and the like, the anode terminal Ta, the cathode terminal Tk, the first control terminal Tc1, the first output terminal Tp1, the second output terminal Tp2, and so on leading to the exterior of the resin sealing portion as lead terminals. It goes without saying that the resin sealing portion possesses a two-layer construction of a translucent inner resin sealing portion and an opaque outer resin sealing portion.

Further, the SSR 1 is preferably in the form of a dual in-line package in which the input-side lead frame and the output-side lead frame are mutually opposed, from the vantage point of ease of mounting (attaching, equipping) to the wiring substrate (not shown), ease of connecting the externally-connected protective element, ensuring breakdown voltage between the input and the output, and so on.

By using the light-emitting diode 2 as a light-emitting element, the photo triad 3 as a light-receiving element, and the triad 4 as a load-controlling power element, a highly efficient SSR can be achieved which is capable of controlling a large power supply at high speeds.

Second Embodiment

Figure 2:
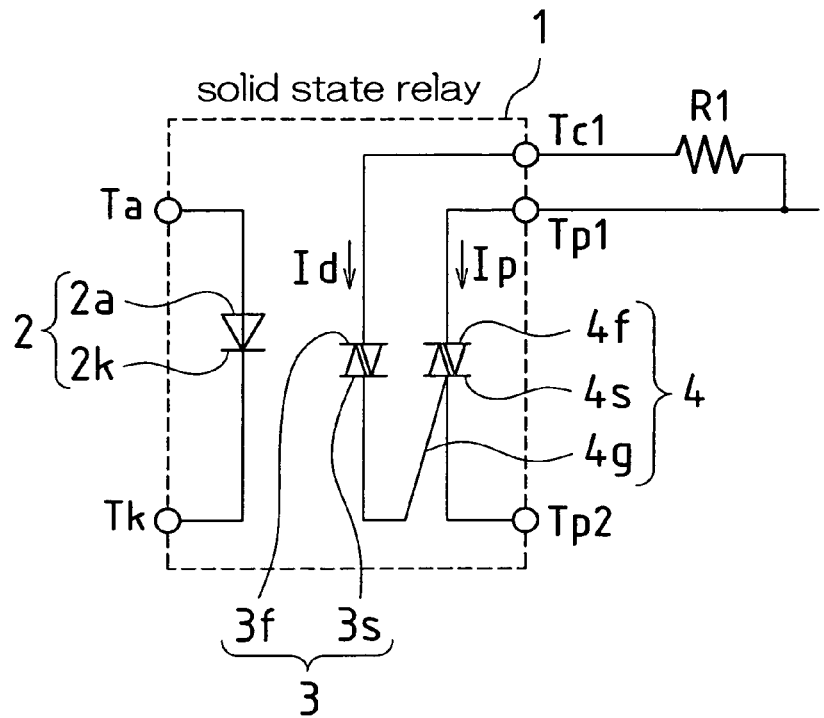
FIG. 2 is a wiring diagram of an SSR according to a second embodiment of the present invention.

FIG. 2 is a wiring diagram of an SSR according to a second embodiment of the present invention.

According to the present embodiment, an externally-connected resistor R1 is connected between the first control terminal Tc1 and the first output terminal Tp1 as an externally-connected protective element on the SSR 1 of the first embodiment. Connecting the externally-connected resistor R1 eliminates the need to provide a protective element inside the resin sealing portion, so the insulation distance between the input and the output inside the resin sealing portion is unaffected, and the input/output breakdown voltage inside the resin sealing portion does not deteriorate even if a protective element is provided. A more detailed description is omitted as the wiring is otherwise the same as in the first embodiment.

The externally-connected resistor R1 may be connected by wiring on the wiring substrate on which the SSR 1 is mounted or it may be connected directly between the first control terminal Tc1 and the first output terminal Tp1 as a lead terminal.

Further, as in the first embodiment, controlling the resistance of the externally-controlled resistor R1 makes it possible to adjust the balance between the control current Id which flows to the photo triad 3 and the load current Ip which flows to the triad 4, making possible accurate operation of the triad 4. In other words, operating the triad 4 in a stable manner can prevent malfunctions. Further, the externally-connected resistor R1 reduces the surge current and voltage by suppressing the control current Id, thereby enabling protection of the photo triad 3, making it possible to achieve a highly reliable SSR 1 which can prevent breakdown of a photo triad 3 by current or voltage surges.

Third Embodiment

Figure 3:
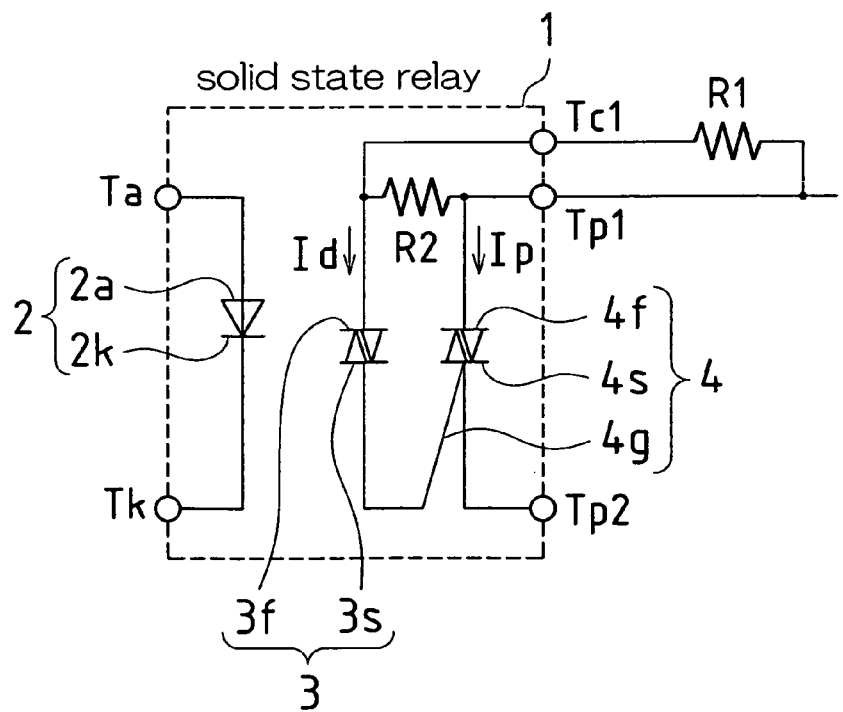
FIG. 3 is a wiring diagram of an SSR according to a third embodiment of the present invention.

FIG. 3 is a wiring diagram of an SSR according to a third embodiment of the present invention.

According to the present embodiment, a built-in resistor R2 is connected as a built-in protective element in the SSR 1 of the second embodiment. The built-in resistor R2 is connected between the first electrode 3f of the photo triad 3 and the first electrode 4f of the triad 4f, and acts as a protective element protecting the photo triad 3 together with the externally-connected resistor R1. A more detailed description is omitted as the wiring is otherwise the same as in the first and second embodiments.

According to the present embodiment, the range of selection of the built-in resistor R2 is broader due to the fact that the externally-connected resistor R1 is connected, which means it is possible to eliminate beforehand a shape which reduces the input/output insulation distance which had been a problem in the conventional example. In other words, the input/output breakdown voltage does not deteriorate, because a small resistor (protective element) can be selected which is of a shape that does not affect the input/output insulation distance.

Specifically, selecting a built-in resistor R2 which is thinner than the chip thickness of the photo triad 3 or the triad 4 makes it possible to provide an SSR which does not deteriorate the input/output breakdown voltage. Note also that while it is preferable for the built-in resistor R2 to be thinner than the chip thickness of the photo triad 3 or the triad 4, the present embodiment is not limited to this.

The photo triad 3 can be protected and the triad 4 can be accurately operated thanks to the externally-connected resistor R1 as in the second embodiment.

Fourth Embodiment

Figure 4:
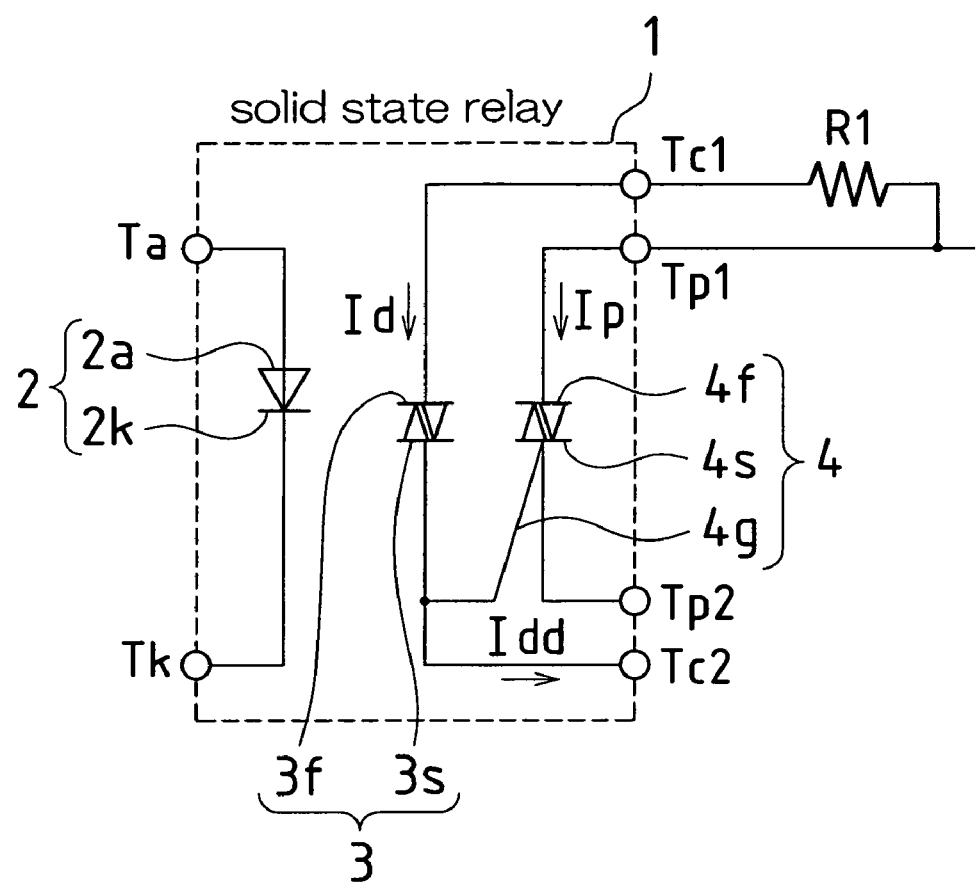
FIG. 4 is a wiring diagram of an SSR according to a fourth embodiment of the present invention.

FIG. 4 is a wiring diagram of an SSR according to a fourth embodiment of the present invention.

According to the present embodiment, in the SSR 1 of the second embodiment the second electrode 3s of the photo triad 3 connected to the gate electrode 4g of the triad 4 is connected to the second control terminal Tc2 which leads individually out as lead terminal to the exterior of the resin sealing portion. A more detailed description is omitted as the wiring is otherwise the same as in the second embodiment.

According to the present embodiment, the second electrode 3s of the photo triad 3 leads out to the exterior of the resin sealing portion as the second control terminal Tc2, making it possible to control other triads (not shown) disposed in the exterior in addition to the triad 4. For example, it is possible to control the external triads by connecting the second control terminal Tc2 to the gate electrode of one of the triads disposed externally as other load-controlling power terminals and passing the control current Idd, which is greater than the gate trigger current, from the second electrode 3s of the photo triad 3.

In other words, it is possible to control a plurality of triads (load-controlling power elements) including the triad 4 by using a single photo triad 3 (light-receiving element), making it possible to apportion (divide, distribute) the load current among the plurality of triads even when controlling a load with a large load current (Ip). Accordingly, the margin for heat release specifications and rated current specifications for the SSR 1 can be broadened.

Fifth Embodiment

Figure 5:
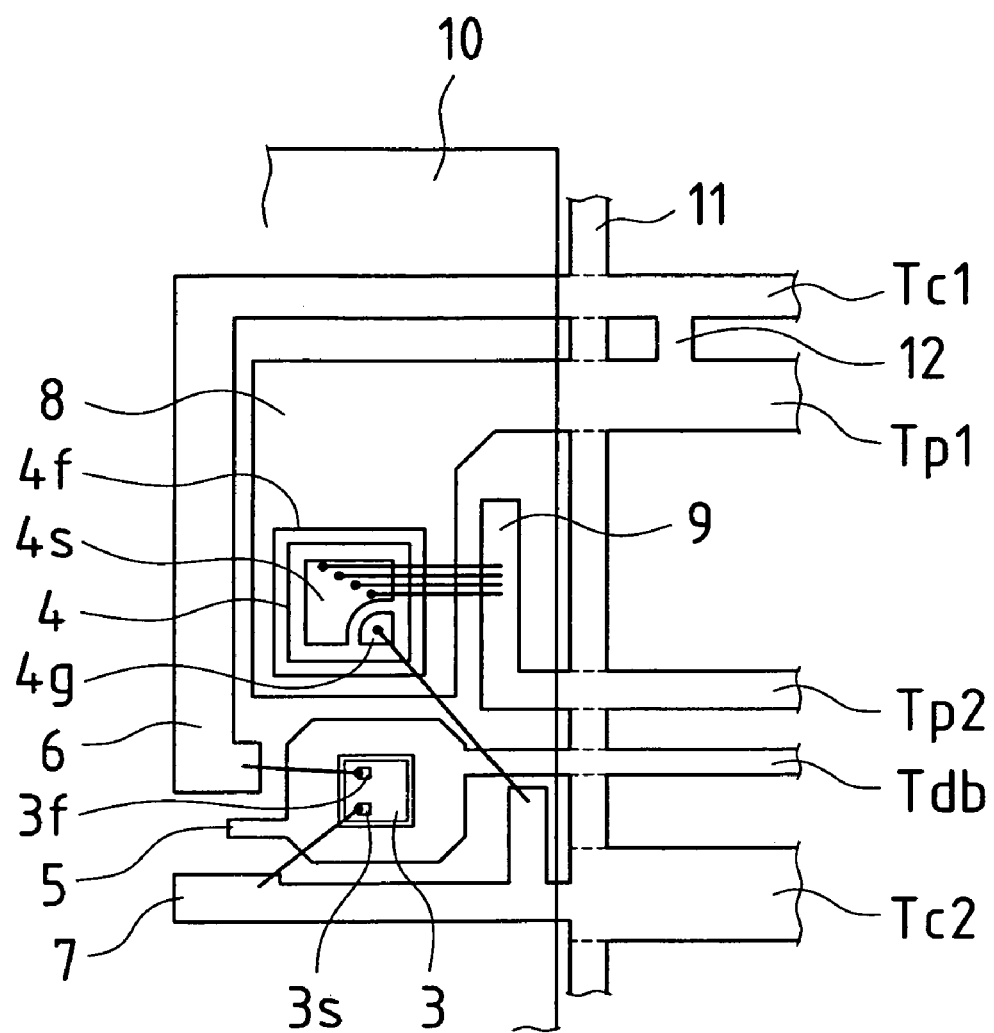
FIG. 5 is a cut-out plan view showing in a simplified manner the main components of the SSR according to a fifth embodiment of the present invention with a triad and so on mounted onto an output-side lead frame and sealed with resin.

FIG. 5 is a cut-out plan view showing in a simplified manner the main components of the SSR according to a fifth embodiment of the present invention with a triad and so on mounted onto an output-side lead frame and sealed with resin.

The photo triad 3 is die-bonded (mounted) to a lead frame 5 which corresponds to a lead terminal Tdb, the first electrode 3f of the photo triad 3 is wire-bonded (mounted) to a lead frame 6 which corresponds to the first control terminal Tc1, and the second electrode 3s is wire-bonded (mounted) to a lead frame 7 which corresponds to a second control terminal Tc2.

The triad 4 is die-bonded (mounted) to a lead frame 8 which corresponds to the first output terminal Tp1, and the first electrode 4f of the triad 4 is connected to a lead frame 8 by die bonding (mounting). Further, the second electrode 4s is wire-bonded (mounted) to a lead frame 9 which corresponds to the second output terminal Tp2. Further, the gate electrode 4g is wire-bonded (mounted) to a lead frame 7 and connected to the second electrode 3s of the photo triad 3 as a result.

The first control terminal Tc1, the second control terminal Tc2, the first output terminal Tp1, the second output terminal Tp2, and the lead terminal Tdb each individually lead to the exterior of a resin sealing portion 10 as lead terminals. Further, as lead terminals, the first control terminal Tc1, the second control terminal Tc2, the first output terminal Tp1, the second output terminal Tp2, and the lead terminal Tdb are ganged by a tie bar portion 11 during the resin sealing stage, creating a configuration which allows transfer molding of the photo triad 3, the triad 4, and the light-emitting diode 2 which is not shown. Note that the tie bar portion 11 is formed on a portion of the lead frame 7 and is connected in a perpendicular orientation with respect to the orientation in which the lead terminals extend, suppressing deformation of the lead terminals and stemming resin leakage during the transfer molding process.

The tie bar portion 11 is cut by die cutting (punching) at the positions shown by the broken line after resin sealing, and the first control terminal Tc1, the second control terminal Tc2, the first output terminal Tp1, the second output terminal Tp2, and the lead terminal Tdb each constitute mutually independent lead terminals. If the lead terminal Tdb and the second control terminal Tc2 do not need to lead to the exterior as lead terminals, they can be cut together with the tie bar portion 11 when it is cut.

According to the present embodiment, the first control terminal Tc1 and the first output terminal Tp1 are interconnected via the bridging portion 12 outside the resin sealing portion 10 (and the tie bar portion 11). The bridging portion 12 is partially formed on the lead frame 8, being formed by a method similar to that of the tie bar portion 11 at approximately the same width as the width of the tie bar portion 11, for example. Specifically, it is formed by punching or a similar process during the manufacturing process of the lead frame 8. Accordingly, the bridging portion 12 can be cut similarly to the tie bar portion 11. In other words, the bridging portion may be connected or may be cut. Note also that the bridging portion 12 is preferably cut after resin sealing in consideration of the effect on wire bonding and the like, but if the tie bar 11 is present, cutting can be performed before resin sealing.

With the SSR 1 used in more diverse environments, the need for countermeasures against surges varies depending on that usage environment. Accordingly, when an externally-connected protective element (an externally-connected resistor R1) is connected because a countermeasure against surges is needed, the bridging portion 12 is cut and the externally-connected element is connected between the first control terminal Tc1 and the first output terminal Tp1.

By providing this kind of cut table bridging portion 12, a multi-purpose lead frame can be achieved, thereby achieving a multi-purpose SSR 1 which allows selection of whether or not to connect an externally-connected protective element according to the usage environment. This selection (i.e., cutting the bridging portion 12) may be performed during the manufacturing process or upon a user's own judgment.

It goes without saying that configurations according to other embodiments may be used concurrently with the present embodiment.

Sixth Embodiment

Figure 6:
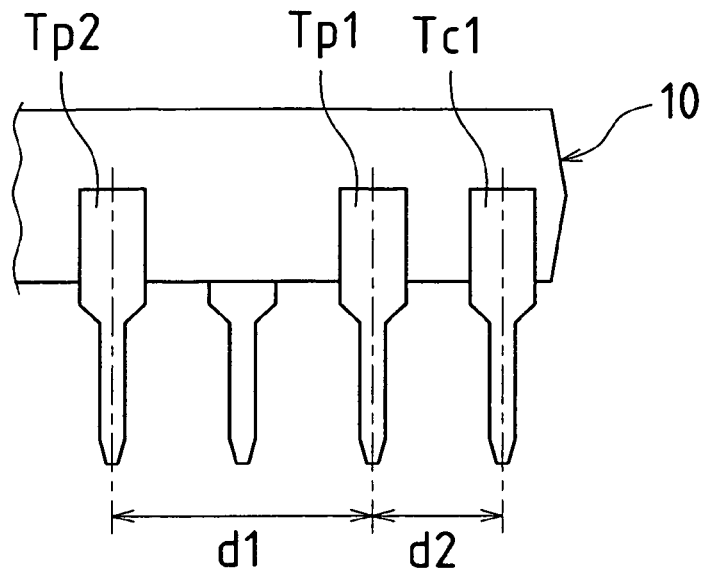
FIG. 6 is a lateral view showing how terminals lead out of the resin sealing portion of the output-side lead frame of the SSR according to a sixth embodiment of the present invention.

FIG. 6 is a lateral view showing how terminals lead out of the resin sealing portion of the output-side lead frame of the SSR according to a sixth embodiment of the present invention.

For example, the first control terminal Tc1, the first output terminal Tp1, and the second output terminal Tp2 lead out of the side where the output-side lead frame leads out as a lead terminal to the exterior of the resin sealing portion 10 which is sealed with resin in the form of a dual in-line package through transfer molding. For a planar arrangement, an arrangement similar to that shown in the fifth embodiment (FIG. 5) is possible.

In the present embodiment, the first output terminal Tp1 leads out between the first control terminal Tc1 and the second output terminal Tp2. Disposing the first control terminal Tc1 on the outside of the position where the first output terminal Tp1 and the second output terminal Tp2, to which the voltage of the load (not shown) is directly applied, are disposed makes it possible to ensure a distance d1 between the first output terminal Tp1 and the second output terminal Tp2 without enlarging the device size by increasing the number of lead terminals (the first control terminal Tc1) leading to the exterior, thereby making it possible to prevent the first output terminal Tp1 and the second output terminal Tp2 from short circuiting outside the resin sealing portion 10, thereby making safe use of the SSR 1 possible.

Further, since the first control terminal Tc1 and the first output terminal Tp1 have approximately the same potential, a distance d2 between the first control terminal Tc1 and the first output terminal Tp1 can be made smaller than the distance d1 between the first output terminal Tp1 and the second output terminal Tp2. In other words, miniaturization of the SSR 1 is possible because of the ability to minimize enlargement of the outer shape of the SSR 1 when the number of the first control terminal Tc1 leading to the exterior as lead terminals increases.

Seventh Embodiment

Figure 7:
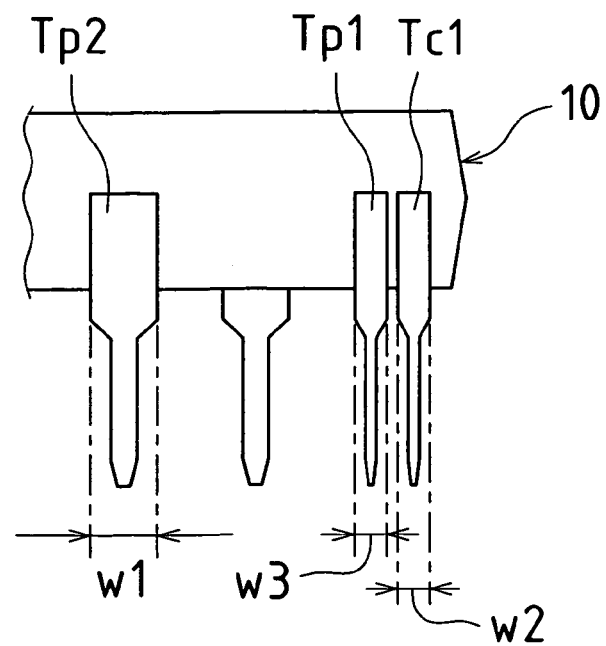
FIG. 7 is a lateral view showing the terminal width of the lead terminals of the output-side lead frame of the SSR according to a seventh embodiment of the present invention.

FIG. 7 is a lateral view showing the terminal width of the lead terminals of the output-side lead frame of the SSR according to a seventh embodiment of the present invention.

In the present embodiment, a terminal width w2 of the first control terminal Tc1 and a terminal width w3 of the first output terminal Tp1 are made smaller than a terminal width w1 of the second output terminal Tp2 (the ordinarily set terminal width w1) at the position where each leads out of the resin sealing portion 10. In other words, by making the terminal width w2 of the first control terminal Tc1 and the terminal width w3 of the first output terminal Tp1, which are disposed adjacently, smaller than the terminal width w1 of other lead terminals makes miniaturization of the SSR 1 possible due to the ability to minimize enlargement of the outer shape of the SSR 1 when the number of the first control terminal Tc1 increases. It goes without saying that the terminal width w2 and the terminal width w3 may be the same width.

Eighth Embodiment

Figure 8:
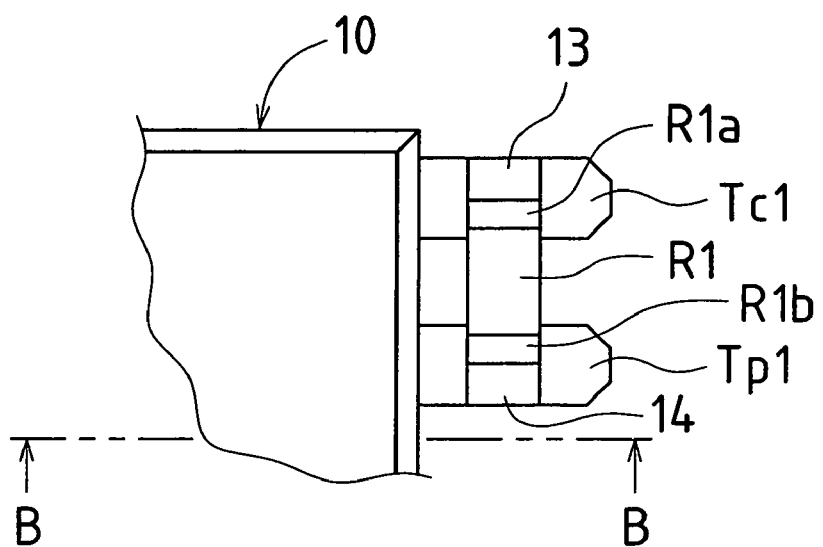
FIG. 8 is an explanatory diagram showing how a mounting portion is provided for mounting a protective element to the SSR according to an eighth embodiment of the present invention and how an externally-connected protective element is mounted.
Figure 8:
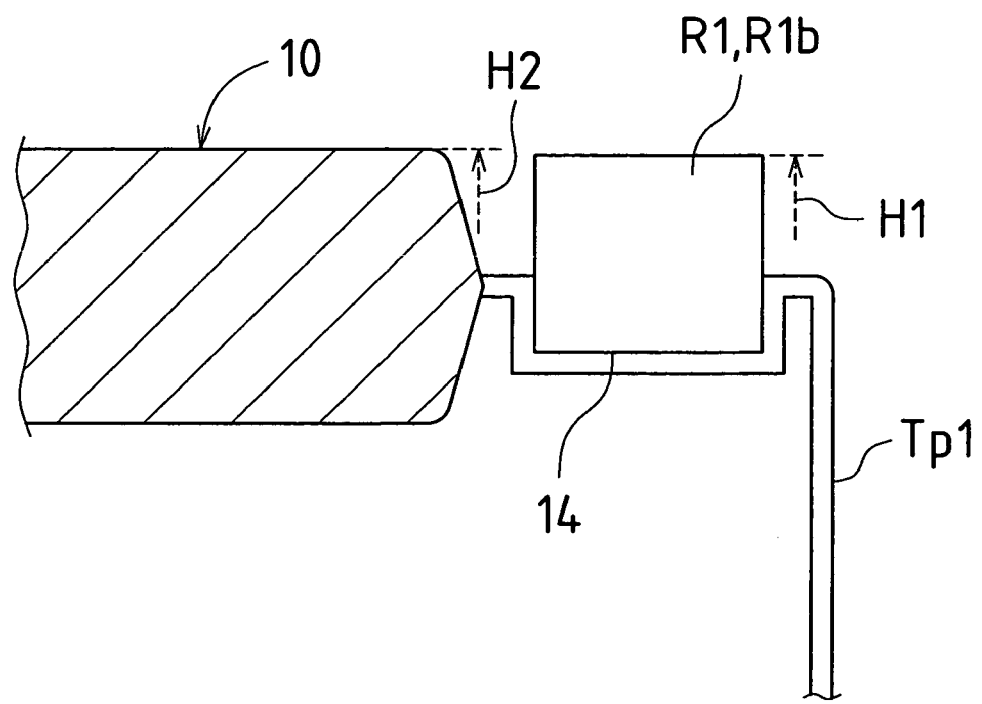

FIG. 8 is an explanatory diagram showing how a mounting portion is provided for mounting a protective element to the SSR according to an eighth embodiment of the present invention and how an externally-connected protective element is mounted. FIG. 8(A) is a partial plan view of the SSR and FIG. 8(B) is a lateral view including a partial cross-section in the direction of arrow B-B in FIG. 8(A).

In the present embodiment, a mounting portion 13 for mounting (connecting) an externally-connected protective element is formed on the first control terminal Tc1 and a mounting portion 14 for mounting (connecting) an externally-connected protective element is formed on the first output terminal Tp1. The mounting portions 13 and 14 can easily be formed by appropriately bending into a concave shape the first control terminal Tc1 and the first output terminal Tp1 as lead terminals. By making the mounting portions 13 and 14 into a shape appropriate for the dimensions of the externally-connected resistor R1 as an externally-connected protective element (e.g., a chip resistor), the externally-connected resistor R1 can easily be positioned and connected. The terminal R1a of the externally-connected resistor R1 is connected to the first control terminal Tc1 (the mounting portion 13), and the terminal R1b is connected to the first output terminal Tp1 (the mounting portion 14) by, for example, soldering.

Connecting the externally-connected resistor R1 between the first control terminal Tc1 and the first output terminal Tp1 obviates the need to form a wiring pattern to connect the externally-connected resistor R1 on the wiring substrate (not shown) on which the SSR 1 is mounted, thereby achieving a wiring substrate which is easy to manufacture and inexpensive.

The concave shape of the mounting portions 13 and 14 enables suppression of a mounting height H1 to equal to or below a height H2 of the resin sealing portion 10 even if the thickness of the chip resistor (the externally-connected resistor R1) is large.

Ninth Embodiment

Figure 9:
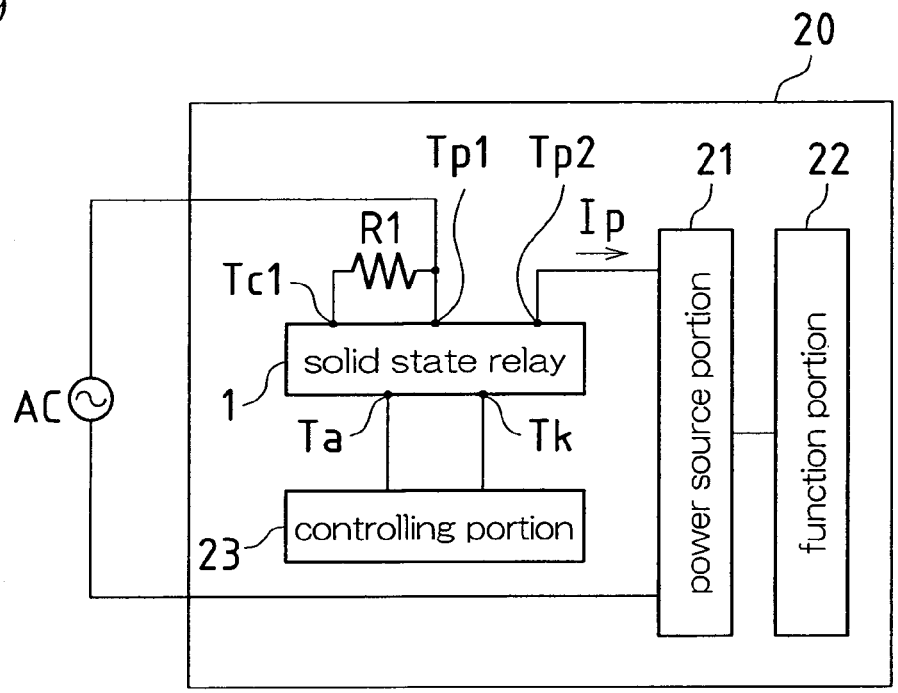
FIG. 9 is a block diagram showing a main component block of an electronic device according to a ninth embodiment of the present invention.
Figure 10:
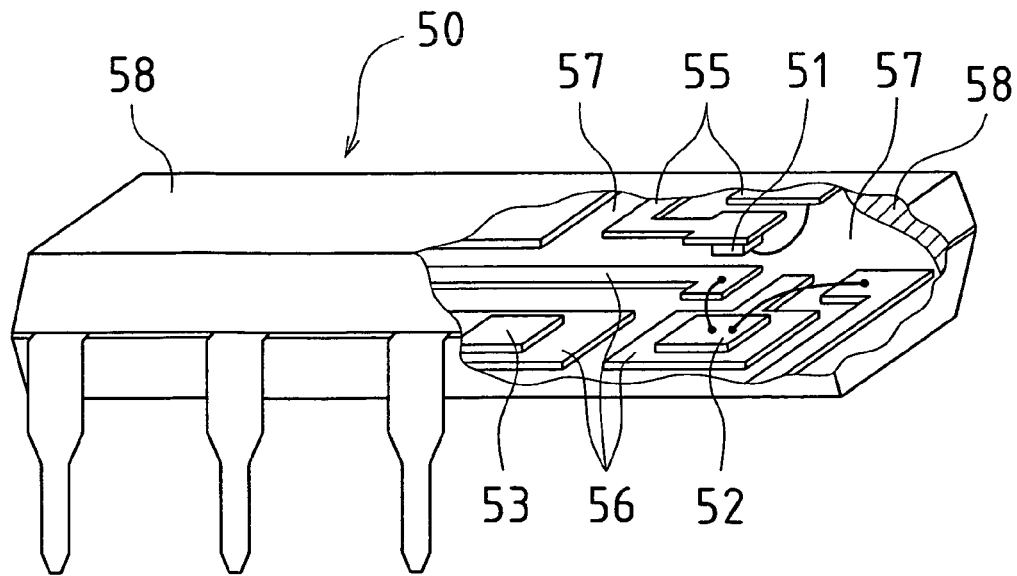
FIG. 10 is a partially cut-away perspective view showing an example of a conventional SSR.

FIG. 9 is a block diagram showing a main component block of an electronic device according to a ninth embodiment of the present invention.

An electronic device 20 has as a main component block a power source portion 21 and a function portion 22 which performs prescribed functional operations, receiving a supply of power from the power source portion 21. Power is supplied to the power source portion 21 from a commercial alternating current power source AC via the SSR 1. The SSR 1 can be switched on an off as appropriate by a controlling portion 23 connected to the anode terminal Ta and the cathode terminal Tk, enabling adjustment of the power supplied to the power source 21. The first output terminal Tp1 is connected to one power source line of the commercial alternating current power source AC and the externally-connected protective resistor R1 is connected between the first control terminal Tc1 and the first output terminal Tp1. The second output terminal Tp2 is connected to the power source portion 21 and supplies a load current Ip which is switched on and off at the appropriate timing.

The electronic device 20 according to the present embodiment is a highly reliable electronic device which operates in a stable manner, due to the fact that mounting the SSR 1 according to the first through eighth embodiments enables prevention of surge breakdown of the SSR 1 by current or voltage surges which enter superposed on the commercial alternating current power source AC. Note that the SSR 1 according to the first through eighth embodiments are not limited to one, but may be two or more.

The present invention may include numerous other embodiments without departing from its spirit or main characteristics. Therefore, the embodiments described are nothing more than simple examples, and must not be interpreted in a limiting manner. The scope of the present invention is that indicated by the scope of the claims, and is not in any way bound by the specification. Moreover, all variations and modifications belonging to a scope commensurate to the scope of the claims are within the scope of the present invention.

What is claimed is:

1. A solid state relay comprising: a light-emitting element which is mounted on an input-side lead frame; a light-receiving element which is mounted on an output-side lead frame and receives light from the light-emitting element; a load-controlling power element which is mounted on the output-side lead frame and driven by the light-receiving element; and a resin sealing portion which molds the light-emitting element, the light-receiving element, and the load-controlling power element;

wherein a first electrode of the light-receiving element is connected to a first control terminal, a first electrode of the load-controlling power element is connected to a first output terminal, a second electrode of the load-controlling power element is connected to a second output terminal, and a second electrode of the light-receiving element is connected to a gate electrode of the load-controlling power element; and the first control terminal, the first output terminal, and the second output terminal each individually lead out to the exterior of the resin sealing portion as lead terminals.

2. The solid state relay according to claim 1, wherein an externally-connected protective element is connected between the first control terminal and the first output terminal outside the resin sealing portion.

3. The solid state relay according to claim 1, wherein the first control terminal and the first output terminal are interconnected via a bridging portion outside the resin sealing portion.

4. The solid state relay according to claim 1, wherein a built-in protective element is connected between the first electrode of the light-receiving element and the first electrode of the load-controlling power element inside the resin sealing portion.

5. The solid state relay according to claim 1, wherein the second electrode of the light-receiving element is connected to the second control terminal, and the second control terminal individually leads out to the exterior of the resin sealing portion as a lead terminal.

6. The solid state relay according to claim 1, wherein the first output terminal is disposed between the first control terminal and the second output terminal.

7. The solid state relay according to claim 1, wherein the distance between the first control terminal and the first output terminal is smaller than the distance between the first output terminal and the second output terminal.

8. The solid state relay according to claim 1, wherein the terminal width of the first control terminal and the first output terminal is narrower than the terminal width of the other lead terminals.

9. The solid state relay according to claim 1, wherein the first control terminal and the first output terminal are provided with a mounting portion for mounting an externally-connected protective element outside the resin sealing portion.

10. The solid state relay according to claim 1, wherein the input-side lead frame and the output-side lead frame are disposed facing each other.

11. The solid state relay according to claim 1, wherein the resin sealing portion is such that the input-side lead frame and the output-side lead frame are sealed with resin to a dual in-line package.

12. The solid state relay according to claim 1, wherein the light-emitting element is a light-emitting diode, the light-receiving element is a photo triac, and the load-controlling power element is a triac.

13. An electronic device wherein the solid state relay according to claim 1 is mounted.

14. A method for manufacturing a solid state relay comprising: a light-emitting element which is mounted on an input-side lead frame; a light-receiving element which is mounted on an output-side lead frame and receives light from the light-emitting element; a load-controlling power element which is mounted on the output-side lead frame and driven by the light-receiving element; and a resin sealing portion which molds the light-emitting element, the light-receiving element, and the load-controlling power element;

wherein a first electrode of the light-receiving element is connected to a first control terminal, a first electrode of the load-controlling power element is connected to a first output terminal, a second electrode of the load-controlling power element is connected to a second output terminal, and a second electrode of the light-receiving element is connected to a gate electrode of the load-controlling power element, the first control terminal, the first output terminal, and the second output terminal each individually lead out to the exterior of the resin sealing portion as lead terminals;

the method comprising:

a step of mounting the light-emitting element onto the input-side lead, and the light-receiving element, and the load-controlling power element onto the output-side lead frame in which the first control terminal and the first output terminal are interconnected via a bridging portion outside the resin sealing portion;

a step of sealing with resin the light-emitting element, the light-receiving element, and the load-controlling power element;

a step of cutting the bridging portion; and a step of connecting an externally-connected protective element between the first control terminal and the first output terminal.

15. An electronic device wherein the solid state relay according to claim 2 is mounted.

16. An electronic device wherein the solid state relay according to claim 3 is mounted.

17. An electronic device wherein the solid state relay according to claim 4 is mounted.

18. An electronic device wherein the solid state relay according to claim 5 is mounted.

19. An electronic device wherein the solid state relay according to claim 6 is mounted.

20. An electronic device wherein the solid state relay according to claim 7 is mounted.

* * * * *